(12) United States Patent
Leobandung

(10) Patent No.: US 11,961,835 B2
(45) Date of Patent: Apr. 16, 2024

(54) TRANSISTOR USAGE METERING THROUGH BIAS TEMPERATURE INSTABILITY MONITORING

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

(*) Notice: Subject to any disclaimer, the term of this patent is extended or adjusted under 35 U.S.C. 154(b) by 116 days.

(21) Appl. No.: 17/520,697

(22) Filed: Nov. 7, 2021

(65) Prior Publication Data

US 2023/0147102 A1 May 11, 2023

(51) Int. Cl.
*H01L 27/02* (2006.01)
*H01L 29/417* (2006.01)

(52) U.S. Cl.
CPC .... *H01L 27/0266* (2013.01); *H01L 29/41766* (2013.01)

(58) Field of Classification Search
CPC ... H01L 22/00; H01L 22/30; H01L 29/41766; H01L 21/8221; H01L 27/0266
See application file for complete search history.

(56) References Cited

U.S. PATENT DOCUMENTS

| | | | |
|---|---|---|---|
| 6,456,104 B1 | 9/2002 | Guarin | |
| 6,731,179 B2 | 5/2004 | Abadeer | |
| 6,903,584 B2 | 8/2005 | Shingo | |
| 7,336,095 B2 | 2/2008 | Erickson | |
| 8,081,003 B2 | 12/2011 | Pacha | |
| 8,260,708 B2 | 9/2012 | Potkonjak | |
| 9,344,358 B2 | 5/2016 | Bhardwaj | |
| 9,513,329 B2 | 12/2016 | Potkonjak | |
| 9,606,172 B2 | 3/2017 | Chen | |
| 9,859,983 B2 | 1/2018 | Orcutt | |
| 10,114,068 B1 | 10/2018 | Chen | |
| 2006/0049886 A1 | 3/2006 | Agostinelli | |

(Continued)

FOREIGN PATENT DOCUMENTS

CN 109752636 5/2019

OTHER PUBLICATIONS

Wu, Jiangang, Authorized officer, National Intellectual Property Administration, PRC, PCT/CN2022/125946, The International Search Report and the Written Opinion, Jan. 6, 2023 Total p. 9.

(Continued)

*Primary Examiner* — Tucker J Wright
(74) *Attorney, Agent, or Firm* — Samuel Waldbaum; Otterstedt & Kammer PLLC

(57) ABSTRACT

A circuit for monitoring usage of an active field effect transistor (FET) includes the active FET and a reference FET, formed in a same structure as the active FET. The active FET and the reference FET both are pFET or both are nFET, and are stacked on each other at a common gate. The circuit also includes a differential current sense circuit (DCSC) and a plurality of switches for connecting terminals of the FETs to logic voltage, ground voltage, and/or the DCSC. The DCSC is configured to measure and compare currents through each of the active and reference FETs when a threshold voltage is applied to the common gate.

19 Claims, 16 Drawing Sheets

(56) References Cited

U.S. PATENT DOCUMENTS

| | | | |
|---|---|---|---|
| 2008/0144386 A1* | 6/2008 | Ng | G11C 29/50 |
| | | | 365/185.21 |
| 2010/0032671 A1 | 2/2010 | Marshall | |
| 2018/0156749 A1 | 6/2018 | Rozeau | |
| 2018/0315838 A1* | 11/2018 | Morrow | H01L 21/823842 |
| 2019/0137563 A1 | 5/2019 | Kwon | |
| 2020/0402984 A1* | 12/2020 | Reznicek | H01L 21/02192 |

OTHER PUBLICATIONS

Miaomiao Wang et al., "Bias Temperature Instability Reliability in Stacked Gate-AllAround Nanosheet Transistor," International Reliability Physics Symposium (IRPS), 2019, 6 pp.

P.- F. Lu and K. A. Jenkins, "A built-in BTI monitor for long-term data collection in IBM microprocessors," International Reliability Physics Symposium (IRPS). 2013, 4A, 6 pp.

* cited by examiner

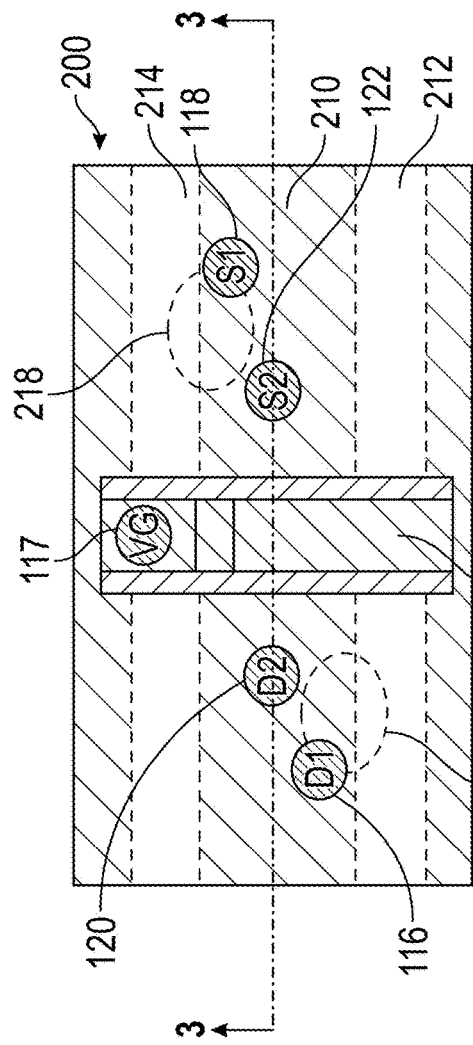
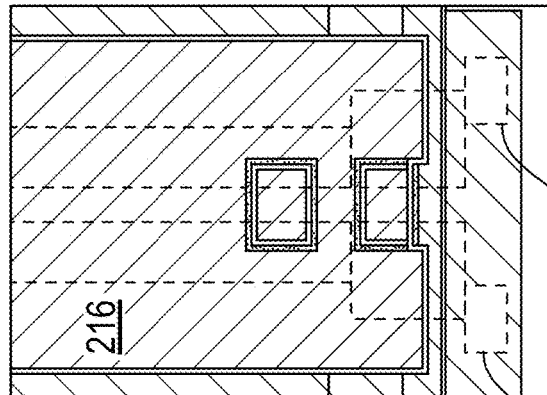
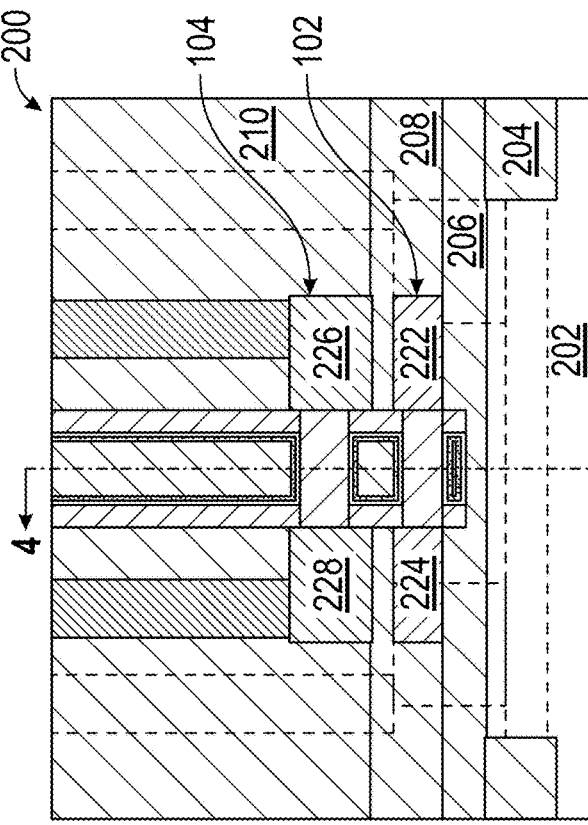

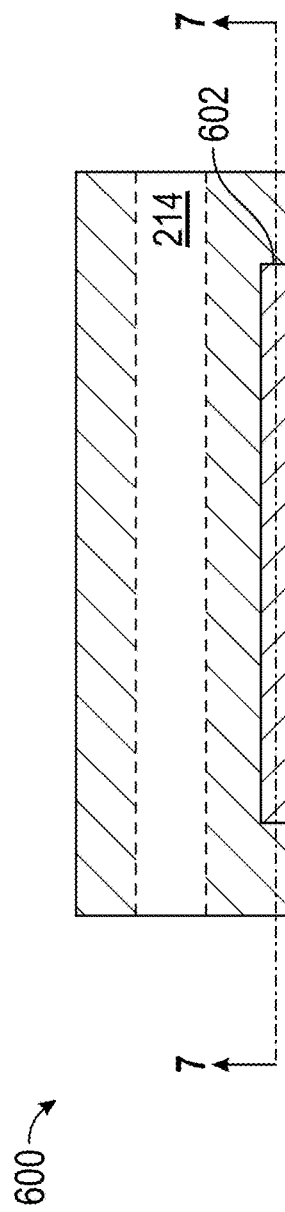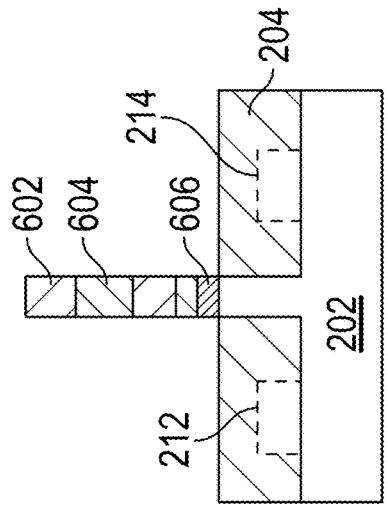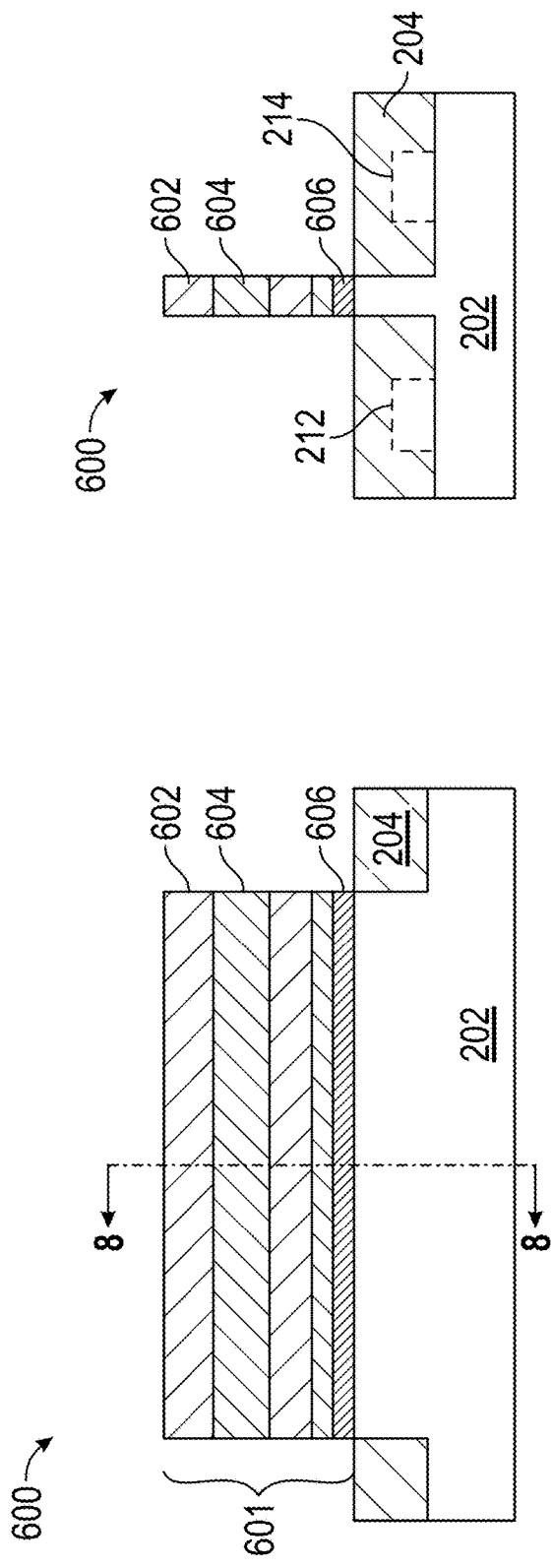

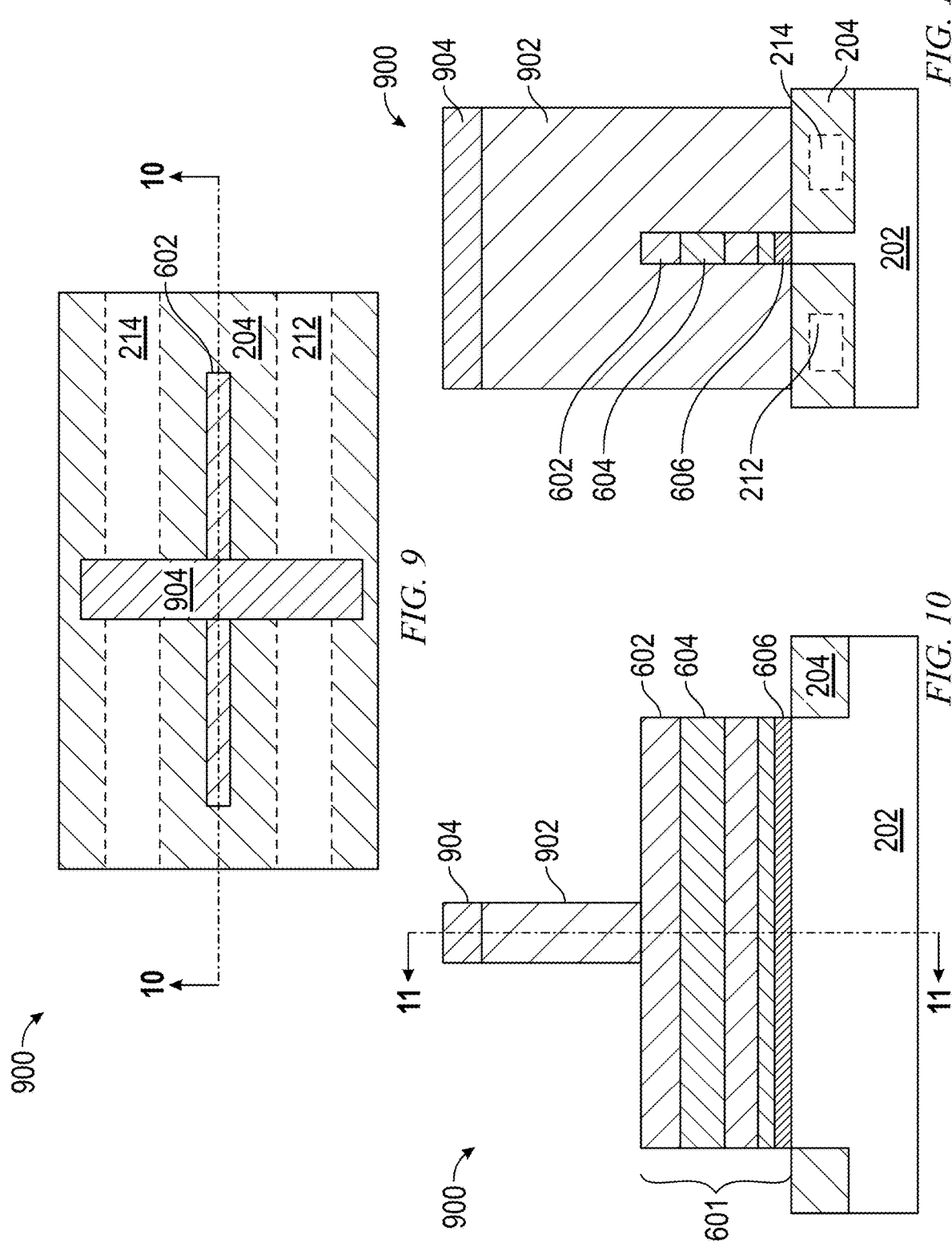

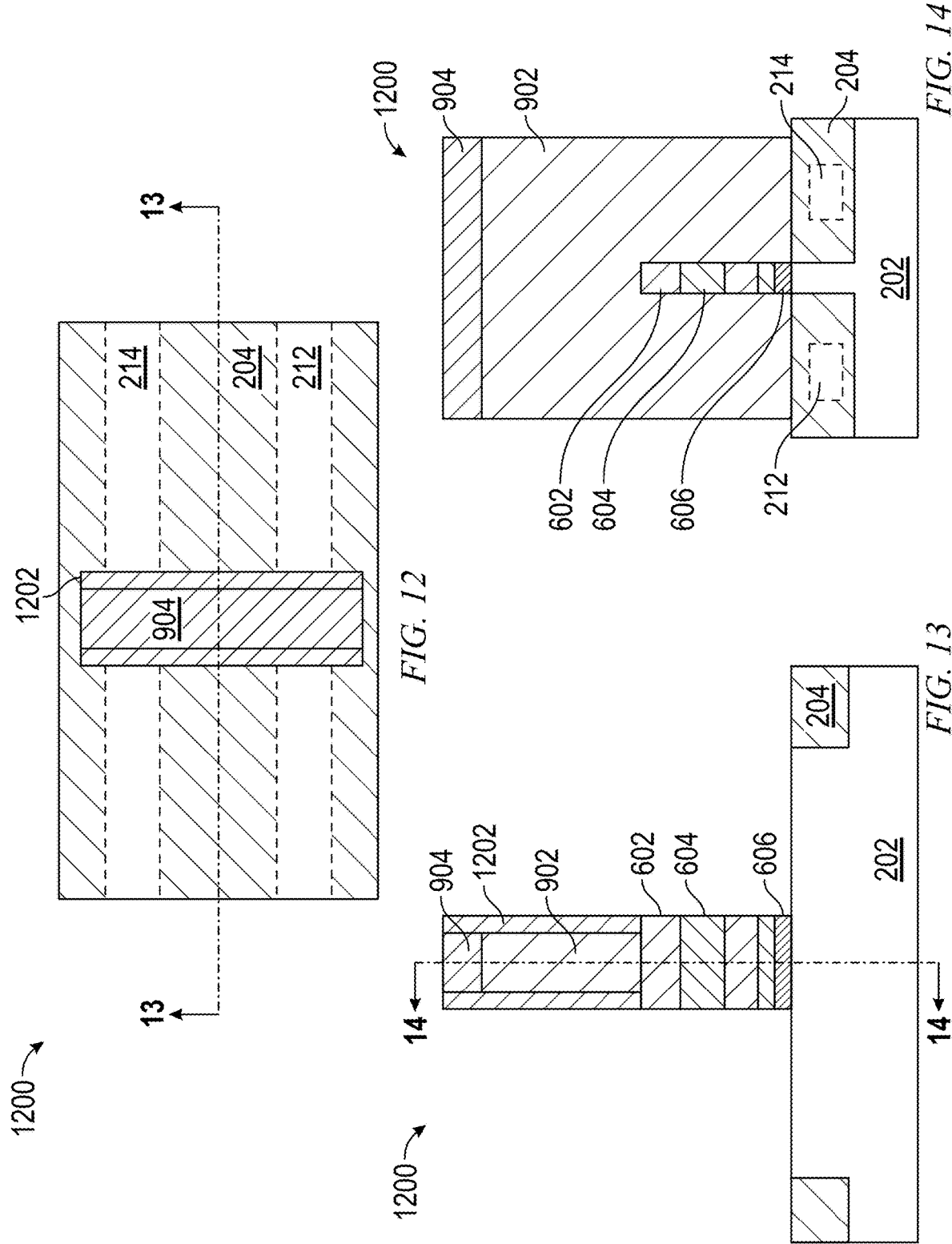

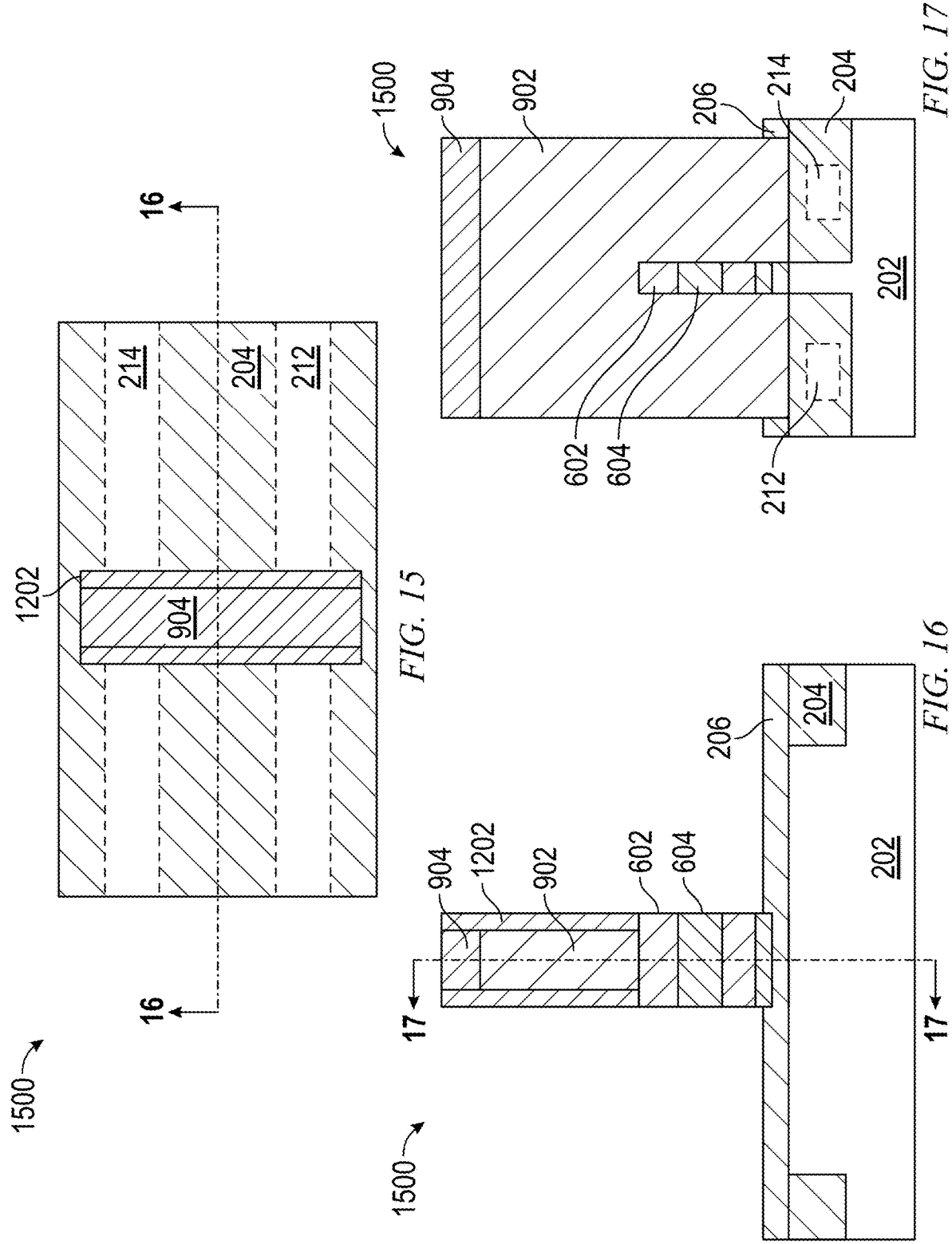

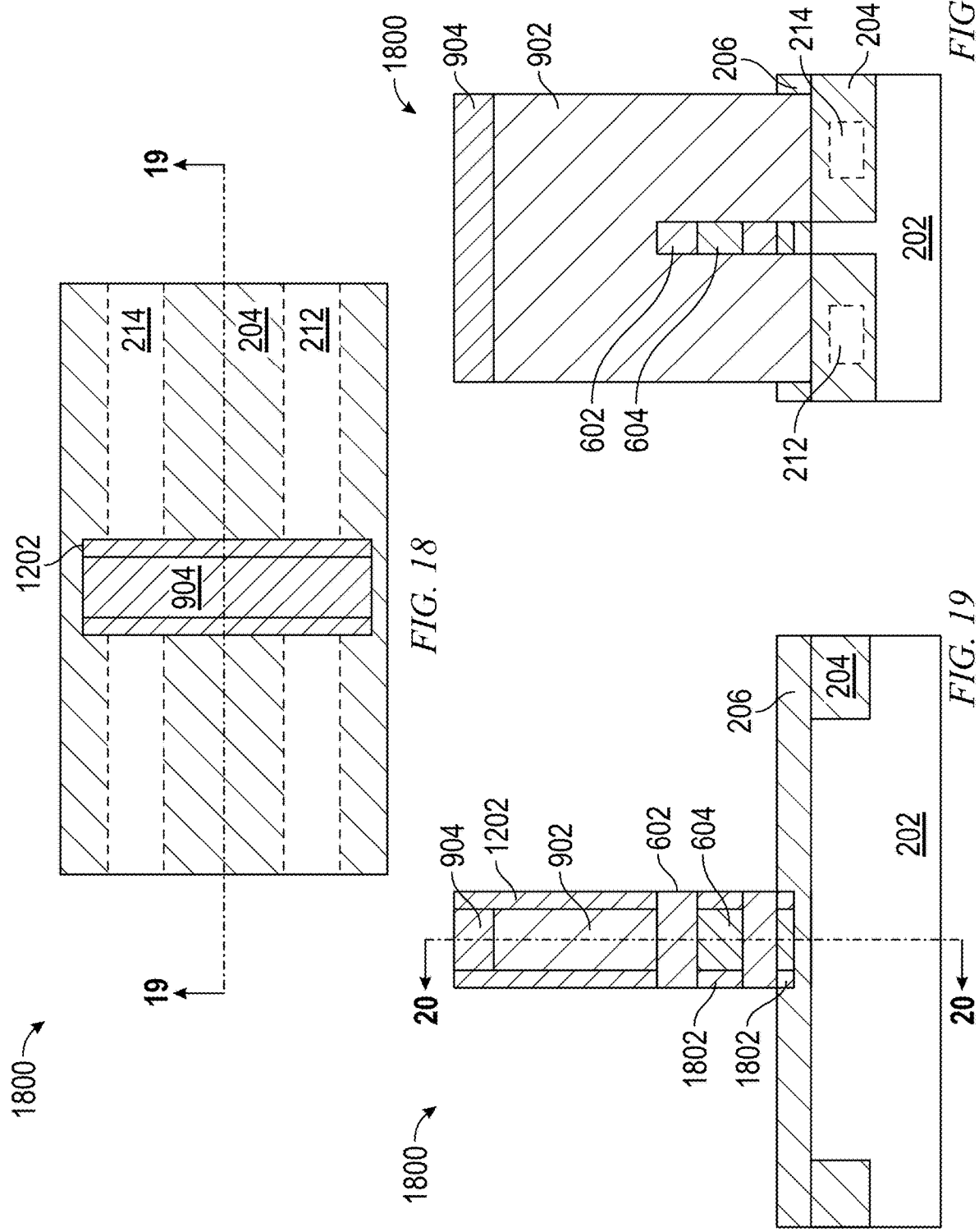

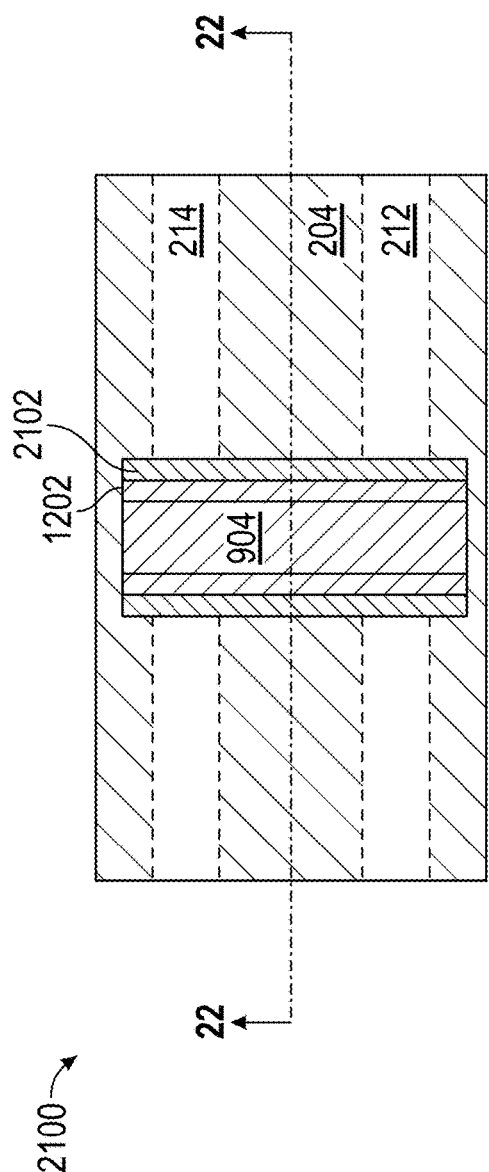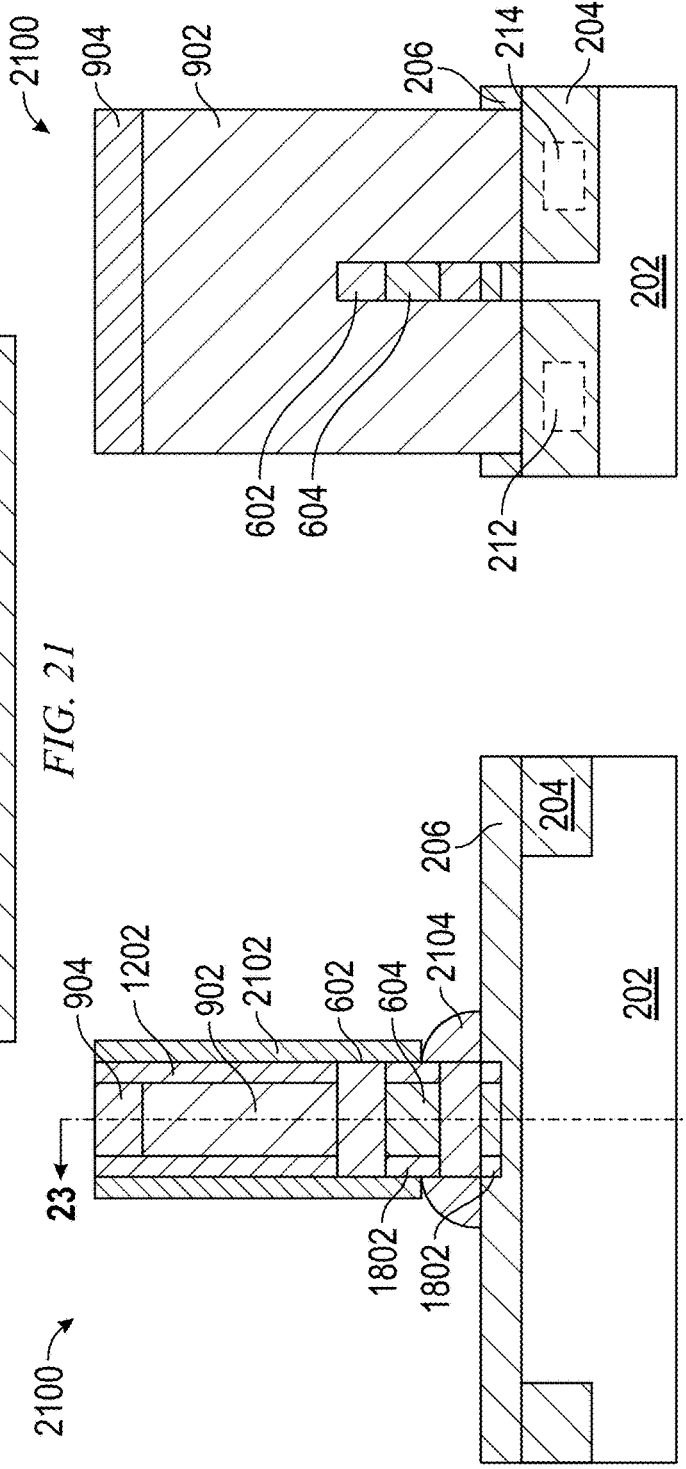

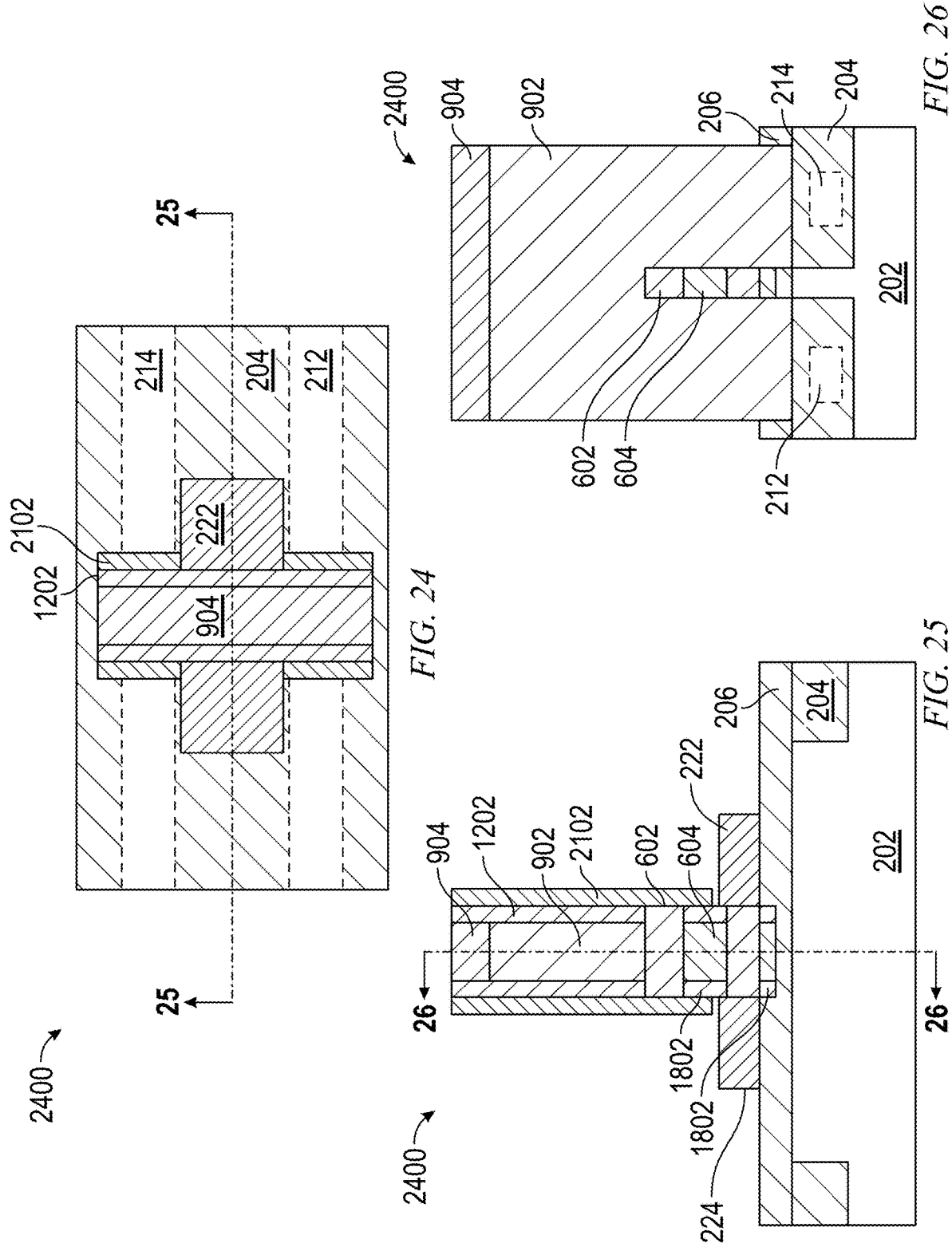

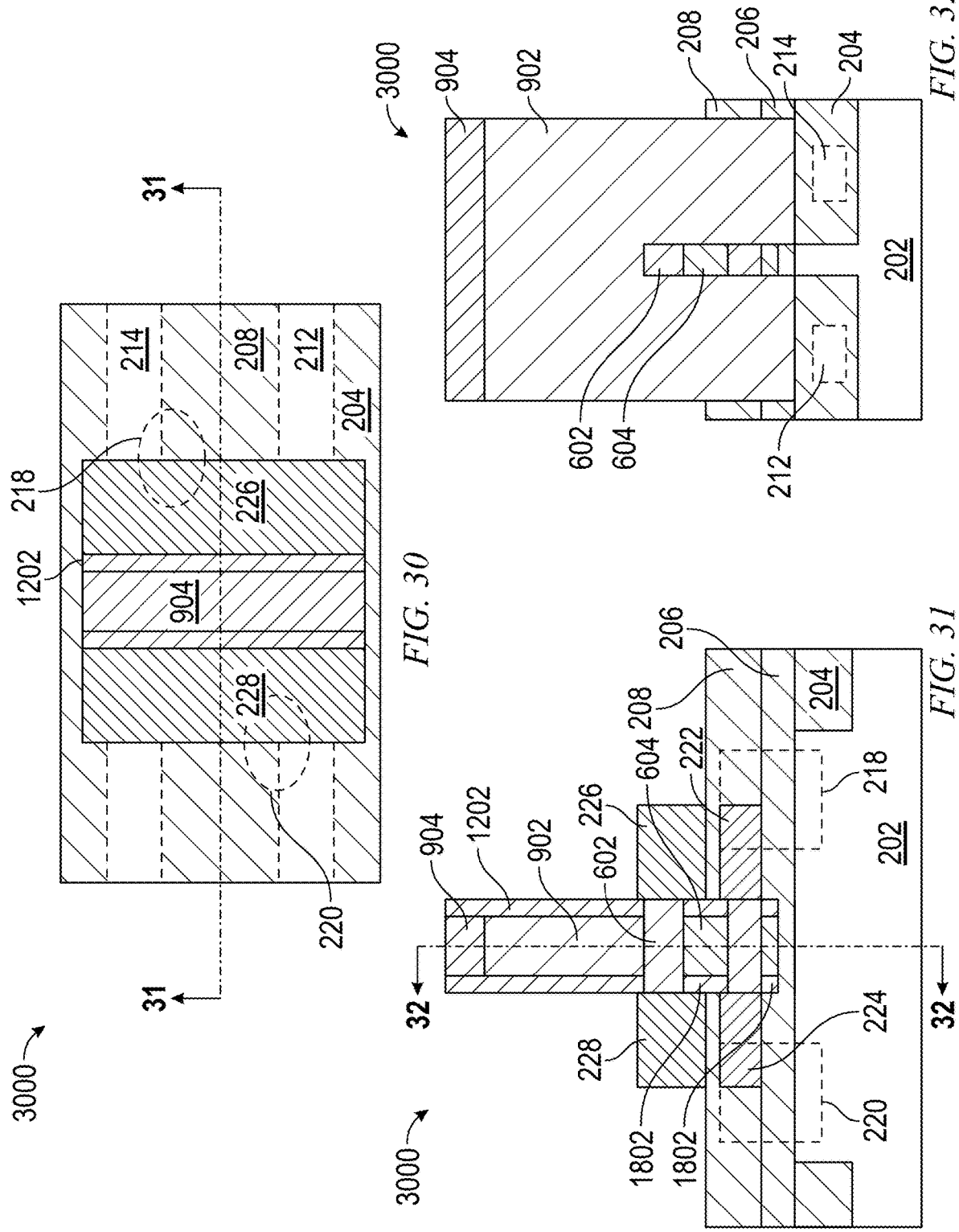

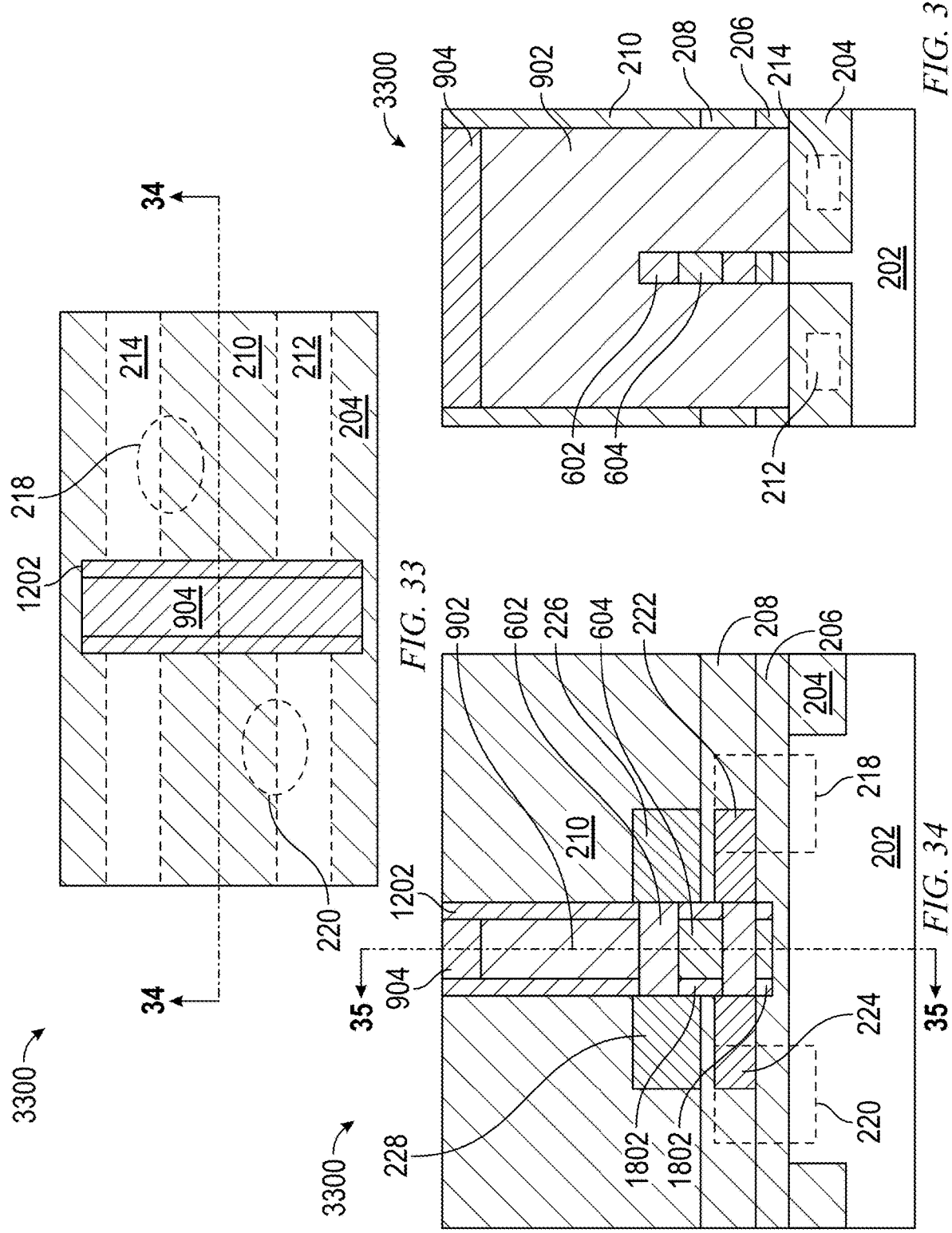

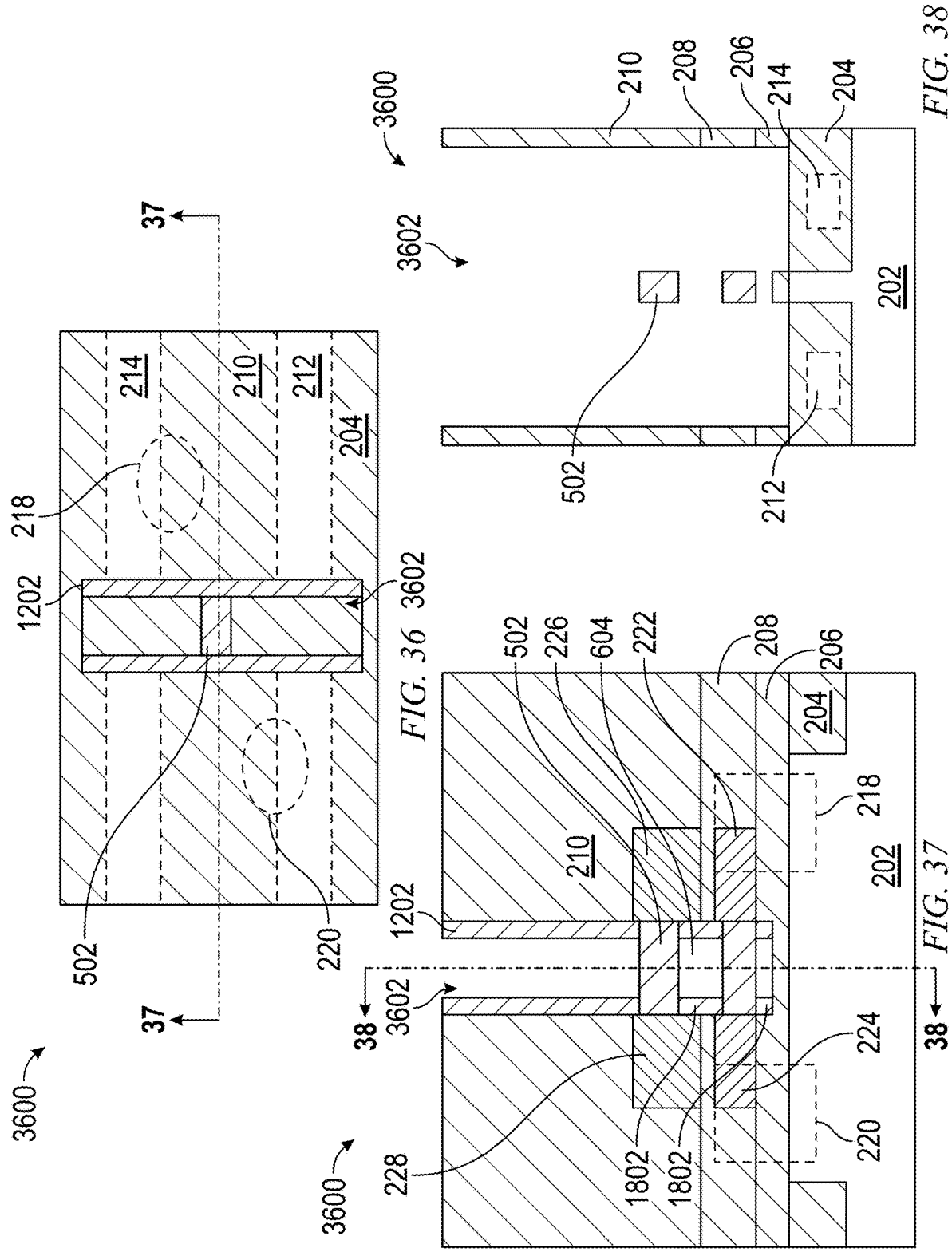

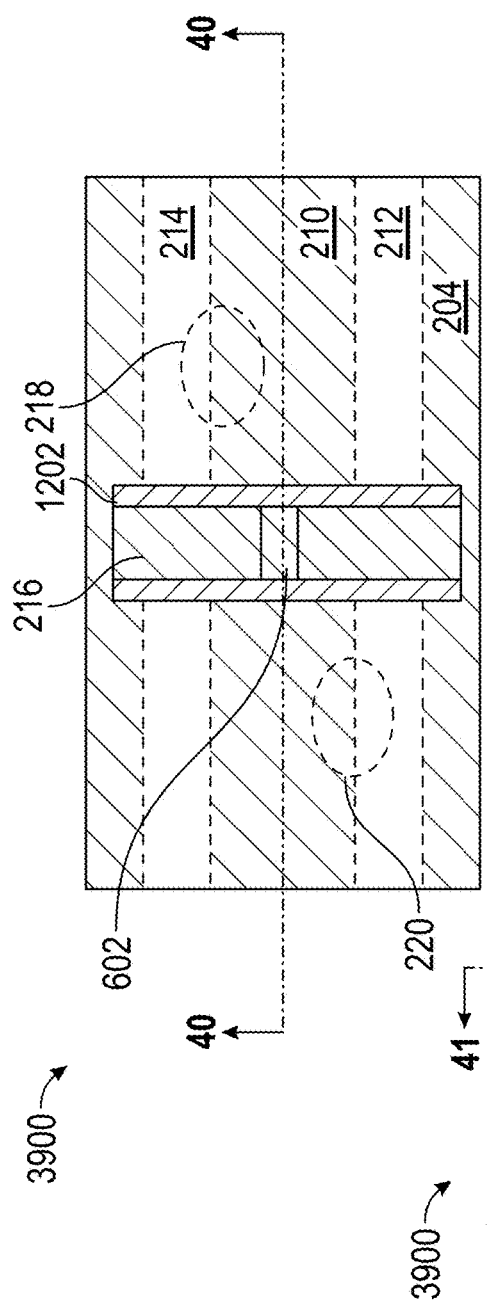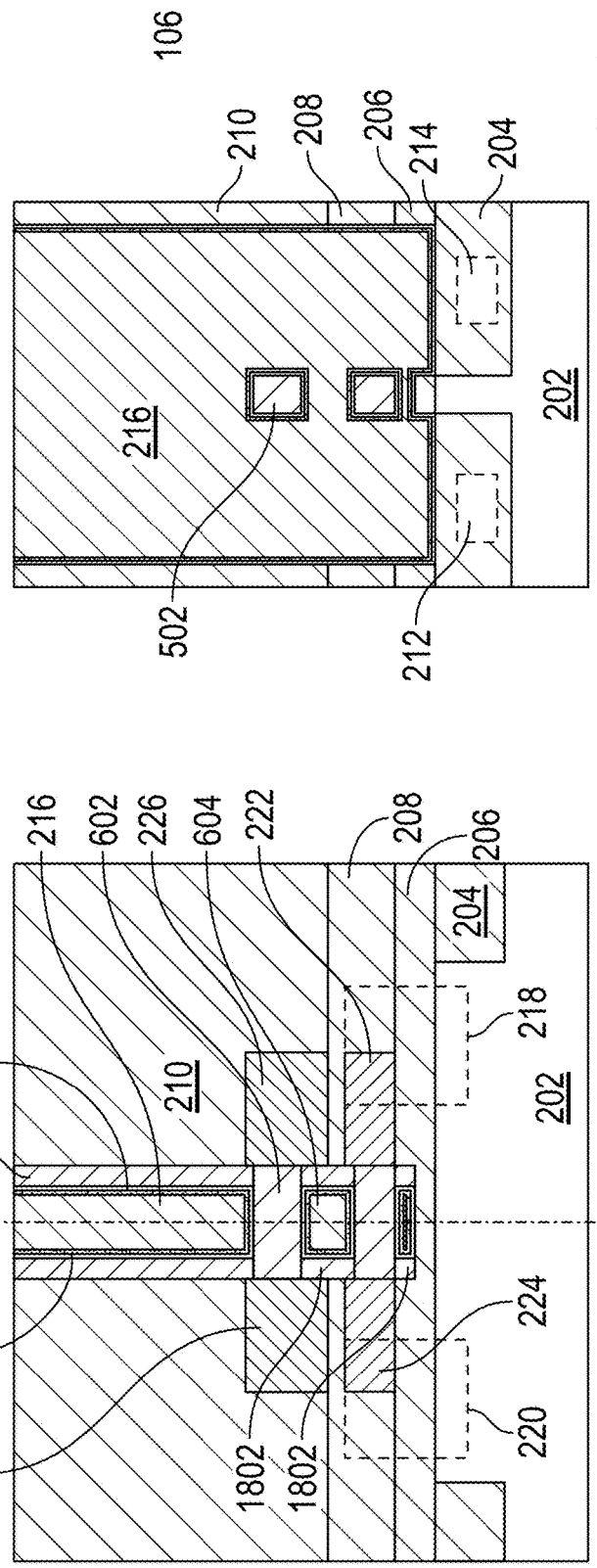
FIG. 39
FIG. 40
FIG. 41

TRANSISTOR USAGE METERING THROUGH BIAS TEMPERATURE INSTABILITY MONITORING

BACKGROUND

The present invention relates to the electrical, electronic, and computer arts, and more specifically, to monitoring age of chips with field effect transistors (FET).

In some cases, electronics vendors recycle chips from old systems and sell them as components of new systems. Chips generally have a limited period of reliable performance, because over time their threshold voltages increase due to charge accumulation in the gate dielectric. This is caused by bias temperature instability, which can produce unpredictable behavior. Therefore, recycled chips sometimes have passed their reliability window and are prone to fail after a short period of further use.

SUMMARY

Principles of the invention provide techniques for transistor usage metering through bias temperature instability monitoring.

In one aspect, an exemplary circuit for monitoring usage of an active field effect transistor (FET) includes the active FET and a reference FET, formed in a same structure as the active FET. The active FET and the reference FET both are pFET or both are nFET, and are stacked on each other at a common gate. The circuit also includes a differential current sense circuit (DCSC) and a plurality of switches for connecting terminals of the FETs to logic voltage, ground voltage, and/or the DCSC. The DCSC is configured to measure and compare currents through each of the active and reference FETs when a threshold voltage is applied to the common gate.

In another aspect, an exemplary electronic circuit for monitoring usage of an active field effect transistor (FET) includes the active FET and a reference FET, formed in a same semiconductor structure as the active FET. The active FET includes an active source, an active drain, and a common gate. The reference FET includes a reference source, a reference drain, and the common gate. The active FET and the reference FET both are pFET or both are nFET, and are stacked on each other at the common gate. The exemplary circuit also includes a differential current sense circuit and a plurality of switches that selectively electrically connect the reference source of the reference FET to the DCSC or to logic voltage, and selectively electrically connect the active source of the active FET to the DCSC or to ground voltage. The differential current sense circuit is configured to measure and compare currents through each of the active and reference FETs when a threshold voltage is applied to the common gate.

According to another aspect, pFETs are used in a similar electronic circuit, in which a plurality of switches selectively electrically connect a reference source to ground voltage or to the DCSC and selectively electrically connect an active source to logic voltage or to the DCSC.

According to another aspect, an exemplary method for monitoring usage of an active field effect transistor (FET) includes providing the active FET and a reference FET in a same semiconductor structure, in which the reference FET shares a common gate with the active FET. The active FET and the reference FET both are pFET or both are nFET, and are stacked on each other at the common gate. The method further includes operating the active FET normally while protecting the reference FET from electrical current; obtaining a baseline current difference by connecting the active FET and the reference FET to a differential current sense circuit at a first time; and monitoring usage of the active FET by connecting the active FET and the reference FET to the differential current sense circuit at a later time and comparing the current difference at the later time to the baseline current difference. Appropriate ones of these method steps can be carried out or otherwise facilitated by the differential current sense circuit 106, optionally with us of an external processor and test software.

According to another aspect, an exemplary semiconductor structure includes an active field effect transistor (FET) and a reference FET, formed in a same semiconductor structure as the active FET. The active FET and the reference FET both are pFET or both are nFET, and are stacked on each other at a common gate. The active FET includes an active source, an active drain, and the common gate. The reference FET includes a reference source, a reference drain, and the common gate.

In view of the foregoing, techniques of the present invention can provide substantial beneficial technical effects. For example, one or more embodiments provide credible estimation of semiconductor device usage and remaining usable life.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

BRIEF DESCRIPTION OF THE DRAWINGS

FIG. 2 through FIG. 4 depict a semiconductor structure that includes the two FETs shown in FIG. 1, according to an exemplary embodiment.

FIG. 6 through FIG. 41 depict intermediate structures during fabrication of the structure shown in FIG. 2 through FIG. 4, according to an exemplary embodiment.

DETAILED DESCRIPTION

Aspects of the invention provide a circuit that can meter usage of an integrated circuit (IC) and show the "age" of an IC, based on "controlled" BTI (Bias Temperature Instability) degradation in a transistor that is stressed during operation of the IC. Typically, transistor BTI degradation cannot be used for IC metering because it fluctuates depending on the FET circuit and also has no absolute starting value. However, aspects of the invention provide and utilize a matched stack of two field effect transistors (FETs) so that the reference starting device and the metered device have a common starting point for BTI.

Figure 1:
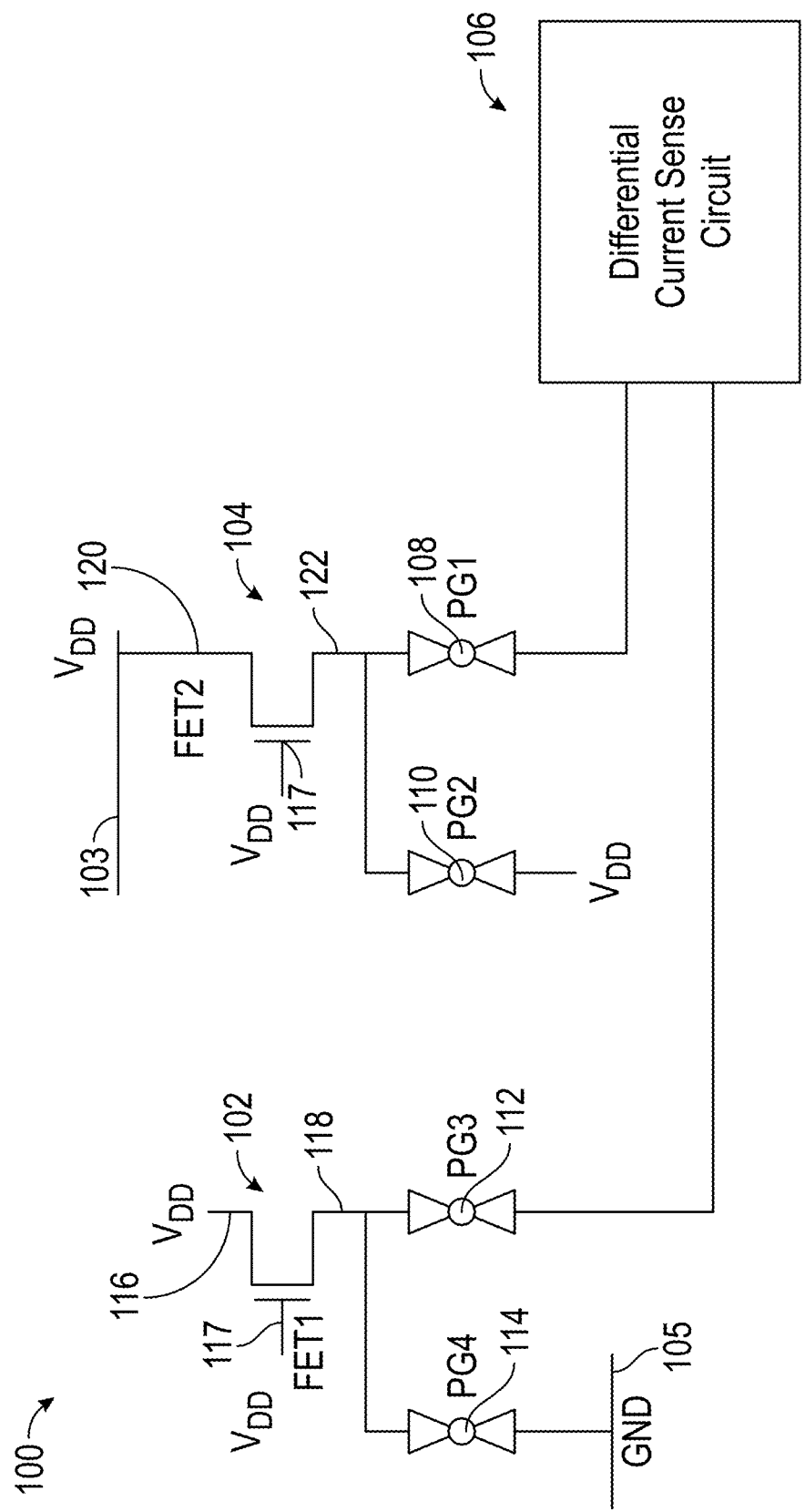
FIG. 1 depicts a circuit that has two n-doped field effect transistors (nFETs) that are operable for monitoring semiconductor device usage, according to an exemplary embodiment.
Figure 42:
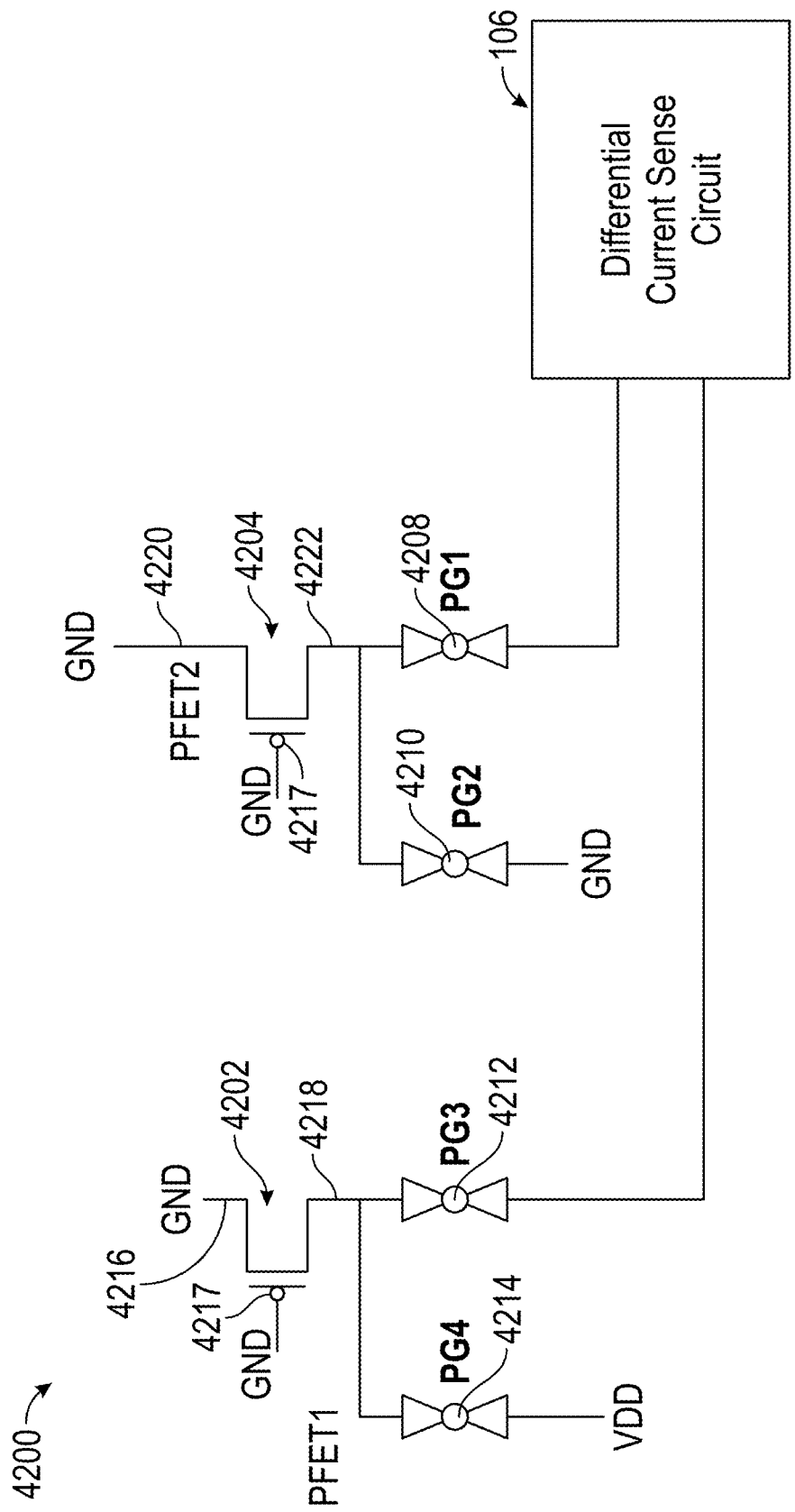
FIG. 42 depicts another circuit that has two p-doped FETs (pFETs) that are operable for monitoring semiconductor device usage, according to an exemplary embodiment.

Referring to FIG. 1, an apparatus 100 according to an exemplary embodiment includes an active nFET1 102 and a reference nFET2 104. The two nFETs 102, 104 are selectively electrically connected, via pass gates PG1 108 and PG3 112, to a differential current sense circuit 106, details of which will be understood by an ordinary skilled worker (e.g., current sense amplifier or current shunt amplifier) As the active nFET1 102 turns on during operation, wear-out mechanisms such as BTI (Bias Temperature instability) and hot carrier effects will increase its on resistance so that the on current will diminish over time. On the other hand, reference nFET2 104 will not turn on during operation; thus, a delta in current between nFET1 102 and nFET2 104 will directly correlate to the how long the chip has been turned-on, i.e. age of the chip. Fabricating the active and reference FETs to match each other ab initio advantageously makes the correlation easier to track. The skilled artisan will appreciate that correlation of time in service to differential current for a given transistor design can be obtained by experiment, and generalized to other transistors of that same design. The two nFETs 102, 104 also are selectively connected (via PG2 110) to logic voltage VDD and (via PG4 114) to GND voltage. nFET1 102 has a drain terminal 116 and a source terminal 118. nFET 104 has a drain terminal 120 and a source terminal 122. nFET1 102 and nFET2 104 share a common gate terminal 117. In FIG. 1, both FETs are shown as nFETs, but paired pFETs equally could be used if connected as shown in FIG. 42, discussed below.

In normal operation, logic voltage is applied to the common gate terminal 117. PG1 108 is off and PG2 110 is on so that FET2 104 is not stressed since all terminals 103, 107, and 122 are at the same voltage. PG3 112 is off and PG4 114 is on so FET1 is stressed since there is voltage applied across terminal 117 and 118. In test operation, PG1 is on and PG2 is off, while PG3 is on and PG4 is off, so that the differential current sense circuit 106 can sense the current delta between FET1 102 and FET2 104. The current delta is then translated to an estimate of usage.

In the example of FIG. 1, the first and second FETs 102, 104 are n-type FETs (NFETS). An NFET will be OFF when the gate-to-source voltage is less than the threshold voltage, and will turn ON (conduct) when the gate-to-source voltage is greater than the threshold voltage. During normal operation, the left-hand (active) NFET1 is ON so that it will degrade over time (the source of NFET1 is grounded through PG4; PG3 open) while the right-hand (reference) NFET2 is OFF (VDD is applied to the source of NFET2 via PG2; PG1 open; gate-to-source voltage is zero) so that it will remain fresh and serve as a basis for comparison. To assess degradation of NFET1, turn ON (reference) NFET2 by grounding its source. Thus, during test, open PG4 and PG2, ground sources via PG3 and PG1, and sense current differential from sense circuit.

FIG. 2 through FIG. 4 depict a semiconductor structure 200 that includes FET1 102 and FET2 104 on substrate 202. Multiple layers of dielectric 204, 206, 208, 210 are built up on the substrate 202. Buried conductor rails 212, 214 are buried in the substrate 202. Both FET1 102 and FET2 104 share gate 216. A first plug 218 electrically connects the buried conductor rail 214 with an active source 222 of FET1 102. A second plug 220 electrically connects the buried conductor rail 212 with an active drain 224 of FET1 102. Gate terminal 117 connects the gate 216 to external circuitry. Active source and drain terminals S1 118 and D1 116 connect the active source 222 and the active drain 224 to external circuitry. The reference drain terminal 120 connects a reference drain 228 of the reference FET2 104 to external circuitry (i.e. logic voltage source). The reference source terminal S2 122 connects a reference source 226 of the reference FET2 104 to external circuitry (i.e. logic voltage source or differential current sense circuit 106).

Figure 5:
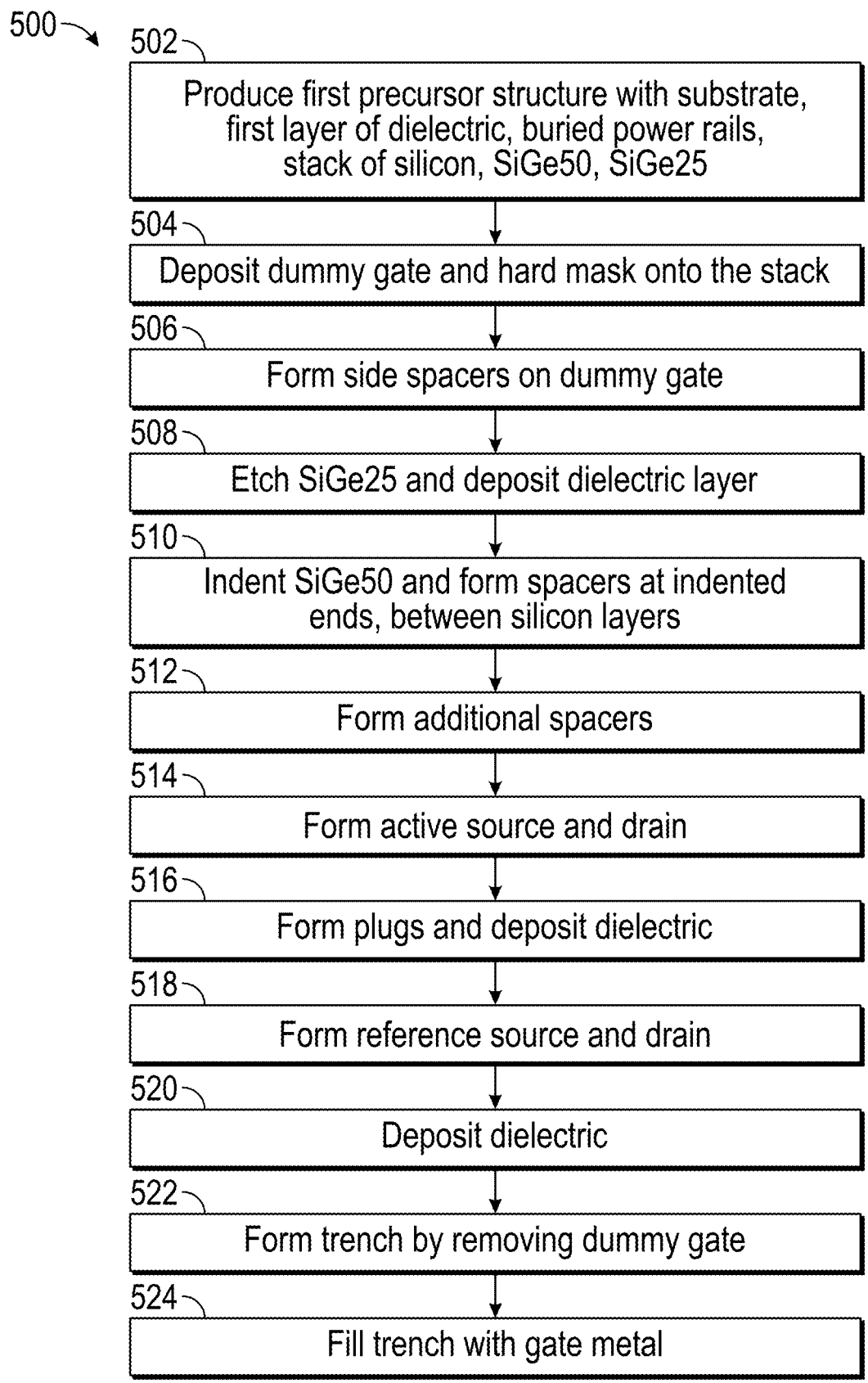
FIG. 5 depicts steps of a method for fabricating the structure shown in FIG. 2 through FIG. 4, according to an exemplary embodiment.

FIG. 5 depicts steps of a method 500 for fabricating the structure 200 (shown, e.g., in FIG. 2). At 502, produce a first precursor structure 600 (as shown by FIG. 6 through FIG. 8) that has a substrate 202, a first layer of dielectric 204, buried conductor rails 212, 214, and a stack 601 of silicon 602, silicon germanium with 50% atomic concentration germanium (SiGe50) 604, and silicon germanium with 25% atomic concentration germanium (SiGe25) 606. This description refers for convenience to intrinsic "silicon" 602, but other n- or p-doped semiconductors equally could be used, so long as they are not equally selective to the same etchants as the SiGe25 and SiGe50. The two layers of silicon 602 should both be doped the same way, to form two paired nFETs or pFETs. At 504, produce a second precursor structure 900 (as shown by FIG. 9 through FIG. 11) by depositing a dummy gate 902 and a hard mask 904 onto the stack 601. At 506, produce a third precursor structure 1200 (as shown by FIG. 12 through FIG. 14) by forming side spacers 1202 on the dummy gate 902. Spacer(s) can be formed by depositing conformal dielectric and etching them anisotropically. At 508, produce a fourth precursor structure 1500 (as shown by FIG. 15 through FIG. 17) by etching the SiGe25 and depositing a dielectric layer 206 on the dielectric layer 204.

At 510, produce a fifth precursor structure 1800 (as shown by FIG. 18 through FIG. 20) by indenting the SiGe50 604 and forming spacers 1802 at the indented ends, between the silicon layers 602. At 512, produce a sixth precursor structure 2100 (as shown by FIG. 21 through FIG. 23) by forming additional spacers 2102, 2104.

Figure 27:
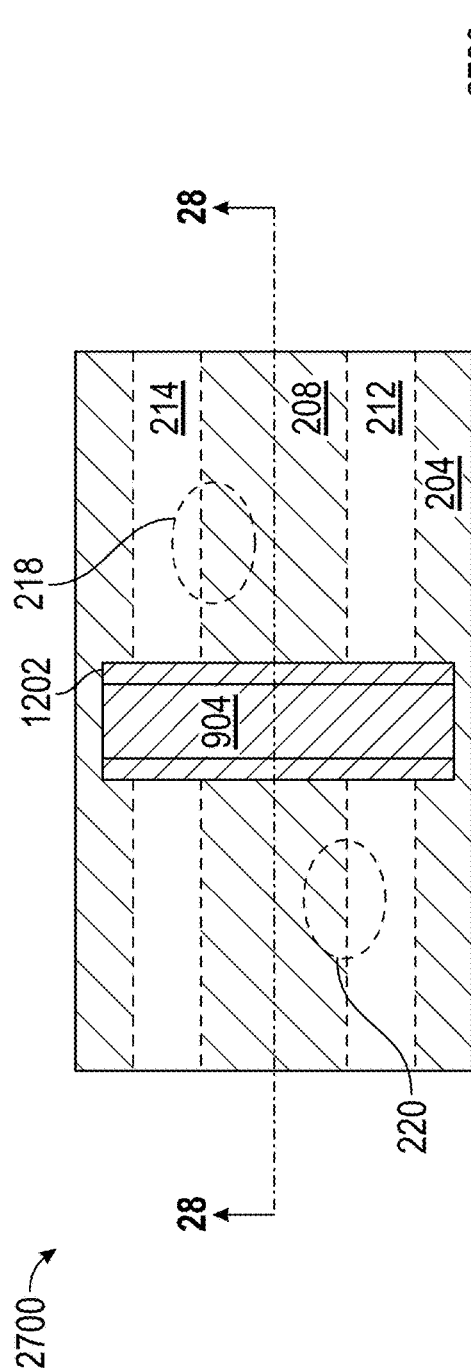
Figure 29:
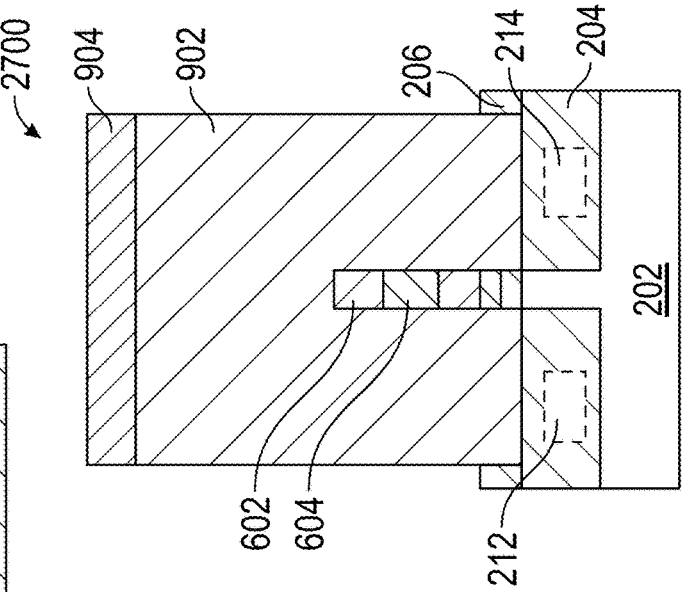
Figure 28:
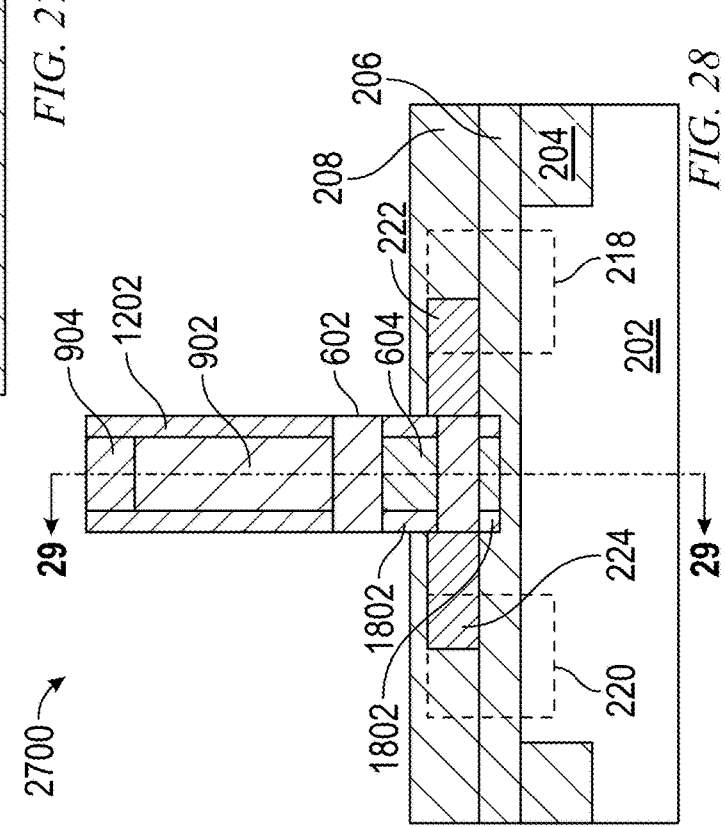

At 514, produce a seventh precursor structure 2400 (as shown by FIG. 24 through FIG. 26) by forming active source 222 and drain 224 after the removal of spacer 2104. At 516, produce an eighth precursor structure 2700 (as shown by FIG. 27 through FIG. 29) by forming plugs 218, 220 and depositing a dielectric layer 208. At 518, produce a ninth precursor structure 3000 (as shown by FIG. 30 through FIG. 32) by forming reference source 226 and drain 228.

At 520, produce a tenth precursor structure 3300 (as shown by FIG. 33 through FIG. 35) by depositing a dielectric layer 210. At 522, produce an eleventh precursor structure 3600 (as shown by FIG. 36 through FIG. 38) by removing the dummy gate 904 to form a trench 3602.

At 524, form a twelfth precursor structure 3900 (as shown by FIG. 39 through FIG. 41) by filling the trench with gate dielectric 3902, work function metal 3904, and gate metal 216. Further steps to produce structure 200 from the twelfth precursor structure 3900, using conventional lithography, etching, and deposition steps, will be apparent to an ordinary skilled worker.

FIG. 42 shows an apparatus 4200 according to an exemplary embodiment includes an active pFET1 4202 and a reference pFET2 4204. The two pFETs 4202, 4204 are selectively electrically connected, via pass gates PG1 4208 and PG3 4212, to a differential current sense circuit 106, details of which will be understood by an ordinary skilled worker (e.g., current sense amplifier or current shunt amplifier). As the active pFET1 4202 turns on during operation, wear-out mechanisms such as BTI (Bias Temperature instability) and hot carrier effects will increase its on resistance so that the on current will diminish over time. On the other hand, reference pFET2 4204 will not turn on during operation; thus, a delta in current between pFET1 4202 and pFET2 4204 directly correlates to the how long the chip has been turned-on, i.e. age of the chip. Fabricating the active and reference FETs to match each other ab initio advantageously makes the correlation easier to track. Again, the skilled artisan will appreciate that correlation of time in service to differential current for a given transistor design can be obtained by experiment, and generalized to other transistors of that same design. The two pFETs 4202, 4204 also are selectively connected (via PG2 4210) to logic voltage VDD and (via PG4 4214) to GND (ground) voltage. pFET1 4202 has a drain terminal 4216 and a source terminal 4218. pFET2 4204 has a drain terminal 4220 and a source terminal 4222. pFET1 4202 and pFET2 4204 share a common gate terminal 4217.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures.

A number of different precursors may be used for the epitaxial deposition of the in situ doped semiconductor material. In some embodiments, the gas source for the deposition of an epitaxially formed in situ doped semiconductor material may include silicon (Si) deposited from silane, di silane, trisilane, tetrasilane, hexachlorodisilane, tetrachlorosilane, dichlorosilane, trichlorosilane, disilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

By "in-situ" it is meant that the dopant that dictates the conductivity type of doped layer is introduced during the process step, for example epitaxial deposition, that forms the doped layer. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

As used herein, the term "conductivity type" denotes a dopant region being p-type or n-type. As further used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. Examples of n-type dopants, i.e., impurities in a silicon-containing substrate include but are not limited to antimony, arsenic and phosphorous.

As an exemplary subtractive process, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (ME), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1$^{st}$ *Edition*, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Work function metal (WFM) layers are disposed over the gate dielectric layer in both the nFET and pFET regions (in embodiments having both types of regions) to complete the gate stacks. Non-limiting examples of suitable work function (gate) metals include p-type work function metal materials and n-type work function metal materials. P-type work function materials include compositions such as ruthenium, palladium, platinum, cobalt, nickel, and conductive metal nitride like TiN, WN, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

The work function metal(s) may be deposited by a suitable deposition process, for example, ALD, CVD, PECVD, PVD, plating, and thermal or e-beam evaporation. Pinch-off of work function metal material between semiconductor fins is essentially avoided during deposition. The WFM layer is removed from one of the nFET and pFET regions in structures including both types of regions while the other region is protected. An SC1 etch, an SC2 etch or other suitable etch processes can be employed to remove the selected portion of the originally deposited WFM layer. A new WFM layer suitable for the region is then deposited. A device formed in the nFET region will accordingly include a WFM layer (gate electrode) having a first composition while a device in the pFET region will have a WFM layer having a second composition. For example, the WFM employed in an nFET region may be a Ti, Al, TiAl, TiAlC or TiAlC layer or a metal stack such as TiN/TiAl/TiN, TiN/TiAlC/TiN, TiN/TaAlC/TiN, or any combination of an aluminum alloy and TiN layers. The WFM layer employed in the pFET region may, for example, be a TiN, TiC, TaN or a tungsten (W) layer. The threshold voltage (Vt) of nFET devices is sensitive to the thickness of work function metals such as titanium nitride (TiN).

Contact material may, for example, alternatively include tantalum (Ta), aluminum (Al), platinum (Pt), gold (Au), titanium (Ti), palladium (Pd) or any combination thereof. The contact material may be deposited by, for example, CVD, PECVD, PVD, plating, thermal or e-beam evaporation, or sputtering. A planarization process such as CMP is performed to remove any electrically conductive material (overburden) from the top surface of the structure.

Exemplary diffusion barriers include tantalum nitride, titanium nitride, indium oxide, copper silicide, tungsten nitride, or similar conductive materials with high resistance to diffusion of metal atoms through their crystal structures.

Exemplary high-k dielectrics include hafnium oxide (HfO), zirconium oxide (ZrO), titanium oxide (TiO), or other materials with k on the order of 3-15 times higher than silicon dioxide (SiO2), e.g., on the order of 10-50, or similar suitable materials.

Exemplary low-k dielectrics include silicon oxides, silicon nitrides, titanium oxides, titanium nitrides, aluminum oxides, aluminum nitrides.

Given the discussion thus far, it will be appreciated that, in general terms, an exemplary electronic circuit 100 for monitoring usage of an active field effect transistor (FET) includes the active FET 102 and a reference FET 104, formed in a same semiconductor structure 200 as the active FET. The active FET includes an active source 222, an active drain 224, and a common gate 216. The reference FET includes a reference source 226, a reference drain 228, and the common gate 216. The active FET and the reference FET both are nFET, and are stacked on each other at the common gate. The exemplary circuit 100 also includes a differential current sense circuit 106 and a plurality of switches 108, 110, 112, 114 that selectively electrically connect the reference source of the reference FET to the DCSC or to logic voltage, and selectively electrically connect the active source of the active FET to the DCSC or to ground voltage. The differential current sense circuit is configured to measure and compare currents through each of the active and reference FETs when a threshold voltage is applied to the common gate.

In one or more embodiments, dopant composition and concentration of the active FET match dopant composition and concentration of the reference FET. In one or more embodiments, layer thickness of the active FET matches layer thickness of the reference FET. In one or more embodiments, effective channel width of the active FET and matches effective channel width of the reference FET. In one or more embodiments, semiconductor alloy composition of the active FET matches semiconductor alloy composition of the reference FET. In one or more embodiments, channel length of the active FET matches channel length of the reference FET. In one or more embodiments, gate dielectric composition of the active FET matches gate dielectric composition of the reference FET.

According to another aspect, pFETs 4202, 4204 are used in a similar electronic circuit 4200, in which a plurality of switches 4208, 4210, 4212, 4214 selectively electrically connect a reference source 4222 to ground voltage or to the DCSC 106 and selectively electrically connect an active source 4218 to logic voltage or to the DCSC.

According to another aspect, an exemplary method for monitoring usage of an active field effect transistor (FET) includes providing the active FET and a reference FET in a same semiconductor structure, in which the reference FET shares a common gate with the active FET. The active FET and the reference FET both are pFET or both are nFET, and are stacked on each other at the common gate. The method further includes operating the active FET normally while protecting the reference FET from electrical current; obtaining a baseline current difference by connecting the active FET and the reference FET to a differential current sense circuit at a first time; and monitoring usage of the active FET by connecting the active FET and the reference FET to the differential current sense circuit at a later time and comparing the current difference at the later time to the baseline current difference.

According to another aspect, an exemplary semiconductor structure 200 includes an active field effect transistor (FET) 102 and a reference FET 104, formed in a same semiconductor structure 200 as the active FET. The active FET and the reference FET both are pFET or both are nFET, and are stacked on each other at a common gate 216. The active FET includes an active source 222, an active drain 224, and the common gate. The reference FET includes a reference source 226, a reference drain 228, and the common gate 216.

In one or more embodiments, the exemplary semiconductor structure also includes a metallic reference source contact 122 that touches the reference source; a metallic reference drain contact 120 that touches the reference drain; a buried metallic source plug 218 that touches the active source; a metallic active source contact 118 that touches the source plug; a buried source conductor rail 214 that touches the source plug; a buried metallic drain plug 220 that touches the active drain; a metallic active drain contact 116 that touches the drain plug; and a buried drain conductor rail 212 that touches the drain plug.

In one or more embodiments, the source conductor rail and the drain conductor rail extend perpendicular to the common gate. In one or more embodiments, a layer of low-k dielectric separates the active source from the reference source and separates the active drain from the reference drain.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An electronic circuit comprising:
   an active field effect transistor (FET) that includes an active source, an active drain, and a common gate;
   a reference FET, formed in a same semiconductor structure as the active FET, that includes a reference source, a reference drain, and the common gate, wherein the active FET and the reference FET both are nFET, and are stacked on each other at the common gate;
   a differential current sense circuit (DCSC); and
   a plurality of switches that selectively electrically connect the reference source of the reference FET to the DCSC or to logic voltage, and selectively electrically connect the active source of the active FET to the DCSC or to ground voltage;
   wherein the DCSC is configured to measure and compare currents through each of the active and reference FETs when a threshold voltage is applied to the common gate.

2. The electronic circuit of claim 1, wherein dopant composition and concentration of the active FET match dopant composition and concentration of the reference FET.

3. The electronic circuit of claim 1, wherein layer thickness of the active FET matches layer thickness of the reference FET.

4. The electronic circuit of claim 1, wherein effective channel width of the active FET matches effective channel width of the reference FET.

5. The electronic circuit of claim 1, wherein semiconductor alloy composition of the active FET matches semiconductor alloy composition of the reference FET.

6. The electronic circuit of claim 1, wherein channel length of the active FET matches channel length of the reference FET.

7. The electronic circuit of claim 1, wherein gate dielectric composition of the active FET matches gate dielectric composition of the reference FET.

8. An electronic circuit comprising:
   an active field effect transistor (FET) that includes an active source, an active drain, and a common gate;
   a reference FET, formed in a same semiconductor structure as the active FET, that includes a reference source, a reference drain, and the common gate, wherein the active FET and the reference FET both are pFET, and are stacked on each other at the common gate;
   a differential current sense circuit (DCSC); and
   a plurality of switches that selectively electrically connect the reference source of the reference FET to the differential current sense circuit or to ground voltage, and selectively electrically connect the active source of the active FET to the differential current sense circuit or to logic voltage;
   wherein the DCSC is configured to measure and compare currents through each of the active and reference FETs when a threshold voltage is applied to the common gate and the active and reference sources are connected to the DCSC.

9. The electronic circuit of claim 8, wherein dopant composition and concentration of the active FET match dopant composition and concentration of the reference FET.

10. The electronic circuit of claim 8, wherein layer thickness of the active FET matches layer thickness of the reference FET.

11. The electronic circuit of claim 8, wherein effective channel width of the active FET matches effective channel width of the reference FET.

12. The electronic circuit of claim 8, wherein semiconductor alloy composition of the active FET matches semiconductor alloy composition of the reference FET.

13. The electronic circuit of claim 8, wherein channel length of the active FET matches channel length of the reference FET.

14. The electronic circuit of claim 8, wherein gate dielectric composition of the active FET matches gate dielectric composition of the reference FET.

15. A semiconductor structure comprising:
   an active field effect transistor (FET) that includes an active source, an active drain, and a common gate;
   a reference FET, formed in a same semiconductor structure as the active FET, that includes a reference source, a reference drain, and the common gate, wherein the active FET and the reference FET both are pFET or both are nFET, and are stacked on each other at the common gate;
   a metallic reference source contact that touches the reference source;
   a metallic reference drain contact that touches the reference drain;
   a buried metallic source plug that touches the active source;
   a metallic active source contact that touches the source plug;
   a buried source conductor rail that touches the source plug;
   a buried metallic drain plug that touches the active drain;
   a metallic active drain contact that touches the drain plug; and
   a buried drain conductor rail that touches the drain plug,
   wherein the active source and active drain are arranged in line with each other, with the source conductor rail disposed to one side of the active source and active drain and with the drain conductor rail disposed to the other side of the active source and active drain,
   the reference source contact and the reference drain contact are disposed between the source conductor rail and the drain conductor rail,
   the source plug is disposed overlapping the active source and the source conductor rail, and
   the drain plug is disposed overlapping the active drain and the drain conductor rail.

16. The semiconductor structure of claim 15, wherein the source conductor rail and the drain conductor rail extend perpendicular to the common gate.

17. The semiconductor structure of claim 15, wherein a layer of low-k dielectric separates the active source from the reference source and separates the active drain from the reference drain.

18. The semiconductor structure of claim 15, wherein semiconductor alloy composition of the active FET matches semiconductor alloy composition of the reference FET.

19. The semiconductor structure of claim 15, wherein dopant composition and concentration of the active FET match dopant composition and concentration of the reference FET.

* * * * *